United States Patent
Choi et al.

(10) Patent No.: US 7,049,218 B2
(45) Date of Patent: May 23, 2006

(54) METHOD OF FABRICATING LOCAL INTERCONNECTION USING SELECTIVE EPITAXIAL GROWTH

(75) Inventors: Jin-ho Choi, Suwon (KR); Han-su Oh, Suwon (KR)

(73) Assignee: Samsung Electronics, Co. Ltd. (KR)

( * ) Notice: Subject to any disclaimer, the term of this patent is extended or adjusted under 35 U.S.C. 154(b) by 90 days.

(21) Appl. No.: 10/766,645

(22) Filed: Jan. 28, 2004

(65) Prior Publication Data

US 2004/0209454 A1    Oct. 21, 2004

(30) Foreign Application Priority Data

Feb. 13, 2003    (KR) .................... 10-2003-0009139

(51) Int. Cl.
*H01L 21/4763* (2006.01)
*H01L 21/44* (2006.01)

(52) U.S. Cl. .................... 438/618; 438/598; 438/607; 438/674

(58) Field of Classification Search ............. 438/674, 438/598, 607, 595, 587, 659, 618, 680
See application file for complete search history.

(56) References Cited

U.S. PATENT DOCUMENTS

| | | | |
|---|---|---|---|
| 5,118,639 A * | 6/1992 | Roth et al. ................ 438/300 |
| 5,166,771 A * | 11/1992 | Godinho et al. ............ 257/368 |
| 5,893,741 A | 4/1999 | Huang ........................ 438/300 |
| 6,335,250 B1 | 1/2002 | Egi ............................. 438/300 |
| 2003/0011001 A1* | 1/2003 | Chevalier et al. .......... 257/197 |

FOREIGN PATENT DOCUMENTS

JP    2000114262    4/2000

OTHER PUBLICATIONS

Wolf et al., Silicon Processing for the VLSI Era, vol. 1, Lattice Press, 2000, p. 245.*

* cited by examiner

*Primary Examiner*—Carl Whitehead, Jr.
*Assistant Examiner*—Heather Doty
(74) *Attorney, Agent, or Firm*—Mills & Onello LLP

(57) ABSTRACT

In a method of fabricating local interconnection, a selective epitaxial growth seed layer pattern is formed on a region of a semiconductor substrate where a local interconnection is to be formed. A selective epitaxial layer is formed by performing epitaxial growth on the resultant structure. The resistance of the selective epitaxial layer is reduced to complete the local interconnection.

21 Claims, 7 Drawing Sheets

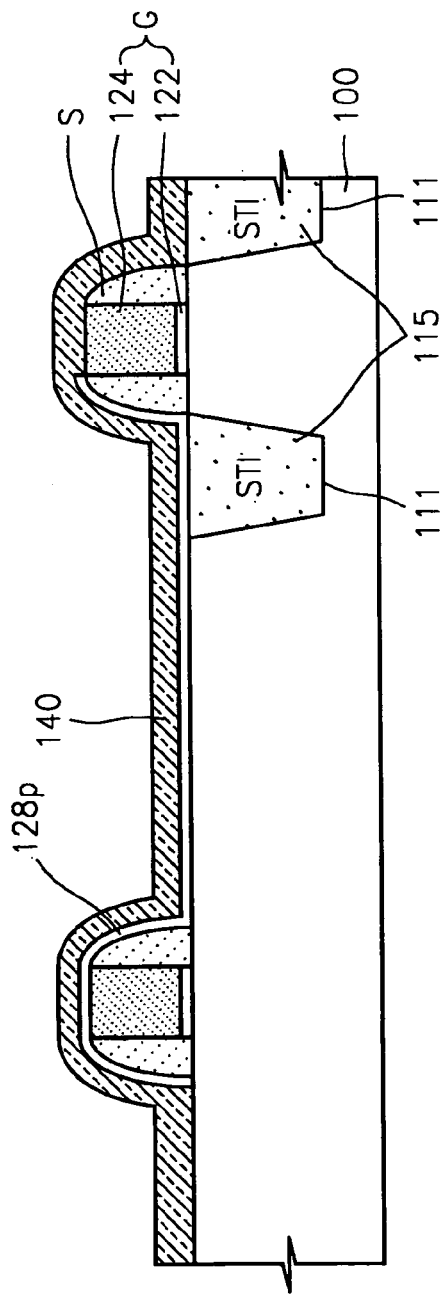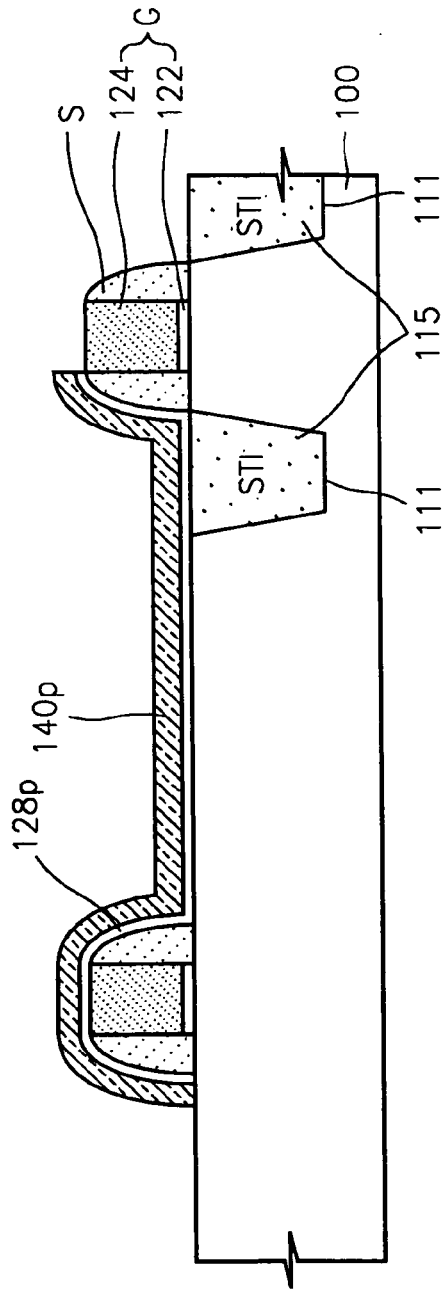

METHOD OF FABRICATING LOCAL INTERCONNECTION USING SELECTIVE EPITAXIAL GROWTH

BACKGROUND OF THE INVENTION

This application claims the priority of Korean Patent Application No. 2003-9139, filed on Feb. 13, 2003, in the Korean Intellectual Property Office, the disclosure of which is incorporated herein in its entirety by reference.

1. Field of the Invention

The present invention relates to a method of fabricating a semiconductor device, and more particularly, to a method of fabricating a local interconnection.

2. Description of the Related Art

As the size and design rule of semiconductor devices gradually become smaller and finer, the degree of integration of semiconductor devices increases, and scaling of a metal oxide semiconductor field effect transistor (MOSFET) as an important component constituting semiconductor devices is gradually reduced. However, reduction in scaling of MOSFET causes the length of the effective channel of the transistor gate to be reduced, thereby resulting in punch-through between the source and drain and resulting in a phenomenon referred to as the "short channel" effect. To improve punch-through and short channel effect, elevated source/drain techniques have been introduced. In addition, a type of interconnection referred to as a local interconnection is used in order to enhance the efficiency of the resulting circuit layout.

Methods for forming elevated source/drain and local interconnections are disclosed, for example, in U.S. Pat. No. 5,893,741 and Japanese Patent Publication No. 2000-114262.

U.S. Pat. No. 5,893,741 discloses a method in which single crystal silicon is formed on the exposed source/drain, and poly crystal silicon is formed on an oxidized layer or poly crystal gate by a load-lock LPVD-Si method. Following this, the poly crystal silicon is etched, except for the local interconnection. Finally, a silicided local interconnection and a silicided source/drain are formed by performing silicidation.

Japanese Patent Publication No. 2000-114262 discloses a method in which an insulating film is formed for covering the gate electrode. An amorphous silicon film is then formed on the entire surface of the insulating layer, and then the amorphous silicon film is annealed to form a selective epitaxial layer. Next, the amorphous silicon film except for a local interconnection formation part is removed, and a silicided local interconnection and silicided source/drain are formed by performing silicidation.

However, in the approach disclosed in U.S. Pat. No. 5,893,741, when the poly crystal silicon except the local interconnection formation part is removed, only the poly crystal silicon has to be selectively removed without damaging the underlying single crystal silicon on the source/drain. Also, in the approach disclosed in Japanese Patent Publication No. 2000-114262, when the amorphous silicon except the local interconnection formation part is removed, the amorphous silicon is to be selectively removed without damaging the single crystal silicon on the source/drain regions. Selectively removal of only the poly crystal silicon or amorphous silicon without damaging the underlying single crystal silicon is a difficult process. Thus, the aforementioned techniques are limited in implementation.

SUMMARY OF THE INVENTION

The present invention provides a method of fabricating local interconnection that is simplified and can be easily applied.

According to an aspect of the present invention, there is provided a method of fabricating a local interconnection. A selective epitaxial growth seed layer pattern is formed on a region of a semiconductor substrate where a local interconnection is to be formed. A selective epitaxial layer is formed by performing epitaxial growth on the resultant structure. The resistance of the selective epitaxial layer is reduced to complete the local interconnection.

In one embodiment, prior to forming the selective epitaxial growth seed layer pattern, a shallow trench isolation structure is formed on the semiconductor substrate to define an active region. A gate is formed on the active region. A spacer is formed on a sidewall of the gate. Formation of the selective epitaxial growth seed layer pattern comprises forming the selective epitaxial growth seed layer pattern on the shallow trench isolation structure, and forming the selective epitaxial layer comprises forming the selective epitaxial layer on the active region, the selective epitaxial growth seed layer pattern, and the gate. The local interconnection comprises a local interconnection for connecting a source/drain of a transistor to a source/drain of an adjacent transistor.

In another embodiment, prior to forming the selective epitaxial growth seed layer pattern, a shallow trench isolation structure is formed on the semiconductor substrate to define an active region. First and second adjacent gates are formed on the active region. A spacer is formed on sidewalls of the first and second gates. An insulating layer pattern is formed for exposing an active region adjacent the first gate and for exposing the second gate. In this case, formation of the selective epitaxial growth seed layer pattern comprises forming the selective epitaxial growth seed layer pattern on the insulating layer pattern, and forming the selective epitaxial layer comprises forming the selective epitaxial layer on the active region adjacent the first gate, the selective epitaxial growth seed layer pattern, and the second gate. The local interconnection comprises a local interconnection for connecting a source/drain of a transistor to a gate of an adjacent transistor.

The resistance of the selective epitaxial layer is reduced to complete the local interconnection, for example, by reducing the resistance of the selective epitaxial layer by implanting ions into the selective epitaxial layer or by siliciding the selective epitaxial layer, or both.

The selective epitaxial growth seed layer pattern comprises, for example, an $Si_xO_yN_z$ layer pattern, for example, wherein x is 55, y is 15, and z is 30.

BRIEF DESCRIPTION OF THE DRAWINGS

The above aspect and advantages of the present invention will become more apparent by describing in detail preferred embodiments thereof with reference to the attached drawings in which:

FIGS. 8 through 10 are cross-sectional views illustrating a method of fabricating a local interconnection for connecting a source/drain of a transistor to a gate of an adjacent transistor.

DETAILED DESCRIPTION OF PREFERRED EMBODIMENT

Figure 1:
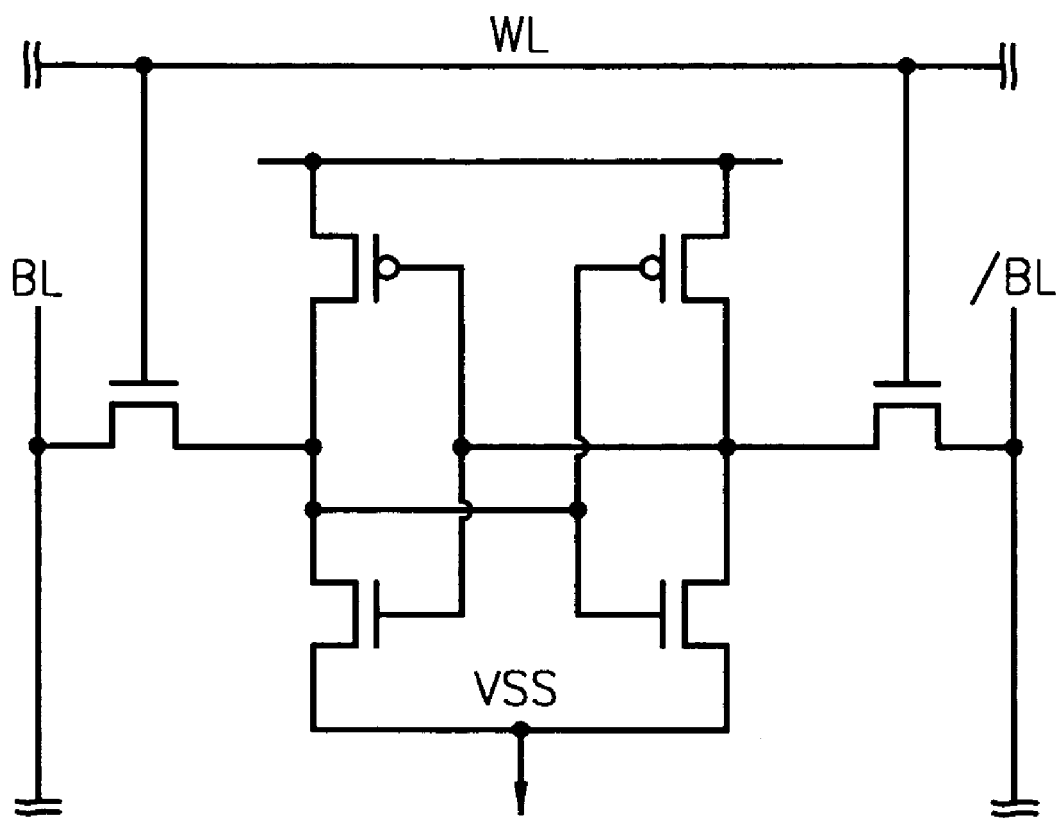
FIG. 1 is an equivalent circuit diagram of a full CMOS SRAM.

The present invention will be described more fully hereinafter with reference to the accompanying drawings in which preferred embodiments of the invention are shown. This invention may, however, be embodied in many different forms and should not be construed as being limited to the embodiments set forth herein. Rather, these embodiments are provided so that this disclosure will be through and complete, and will fully convey the scope of the invention to those skilled in the art. In the drawings, the forms of elements are exaggerated for clarity. Like reference numerals refer to like elements throughout the drawings.

The following embodiments explain a static random access memory (SRAM) as an example of a semiconductor device including local interconnection. In the case of SRAM, a local interconnection is, for example, the interconnection for connecting a source/drain between adjacent transistors to one another or for connecting the source/drain to a gate between adjacent transistors.

FIG. 1 is an equivalent circuit diagram of a full CMOS SRAM. A full CMOS SRAM cell includes two PMOS transistors and four NMOS transistors. The full CMOS SRAM offers the advantages of a simplified formation process, low stand-by current, low Vcc operation, and improved soft error immunity and thus, is widely used in various mobile devices and various disk drivers. In FIG. 1, WL denotes a wordline, BL and /BL denote a bit line, Vcc denotes power supply, and Vss denotes ground.

Figure 2:
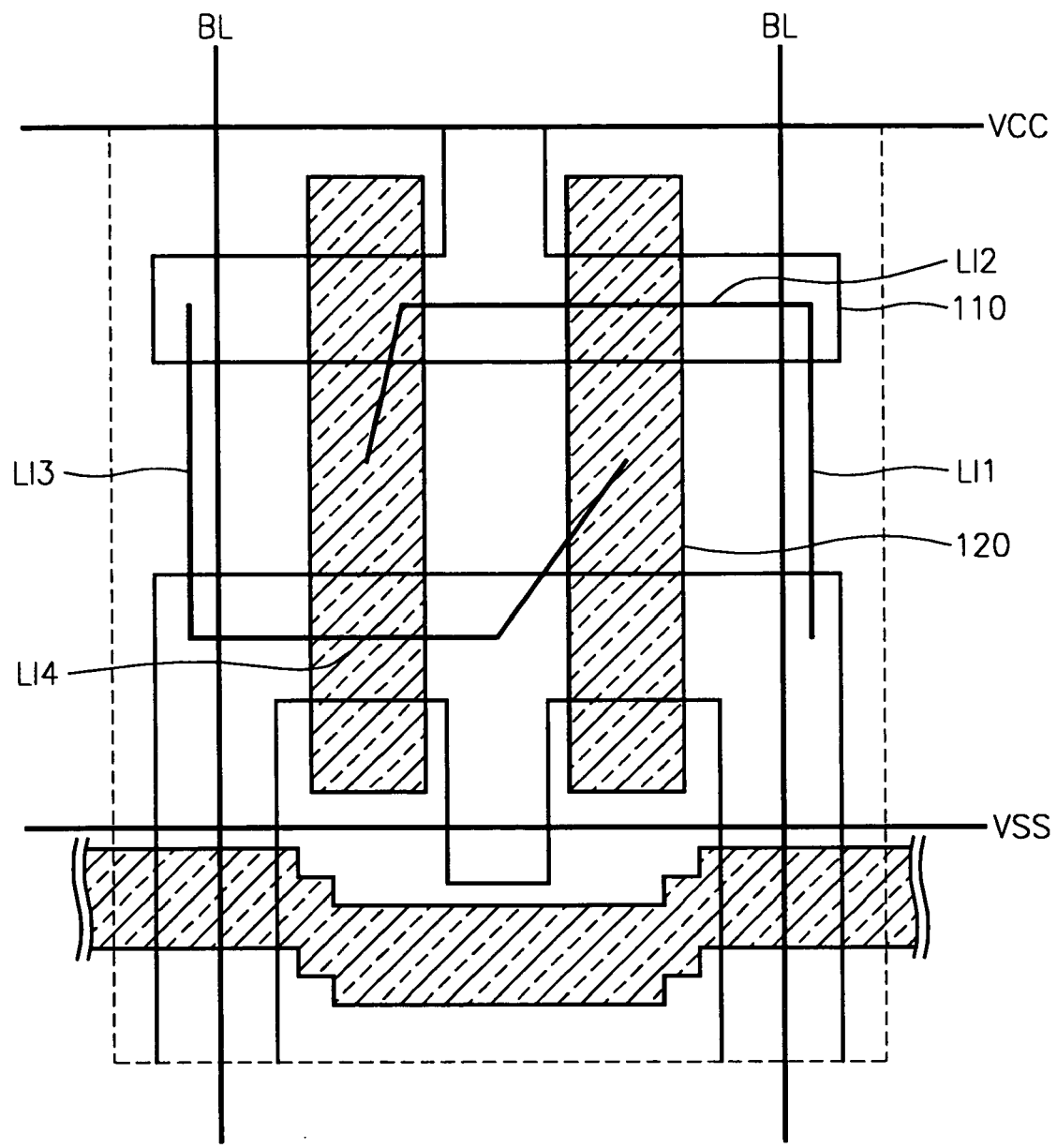
FIG. 2 is a layout diagram illustrating an active region pattern, a gate electrode pattern, and each interconnection used to fabricate the full CMOS SRAM of FIG. 1.

FIG. 2 is a layout diagram illustrating an active region pattern, a gate electrode pattern, and each interconnection used to fabricate the full CMOS SRAM of FIG. 1. A rectangle, indicated by a dotted line, defines one cell. Reference numerals 110 and 120 denote an active region pattern and a gate pattern, respectively. Reference numerals LI1 and LI3 denote local interconnections for connecting the source/drain of a transistor to the source/drain of an adjacent transistor. Reference numerals LI2 and LI4 denote local interconnections for connecting the source/drain of a transistor to gate of an adjacent transistor.

FIGS. 3 through 7 are cross-sectional views illustrating a method of fabricating local interconnections LI1 and LI3 for connecting the source/drain of a transistor to source/drain of an adjacent transistor.

Figure 3:
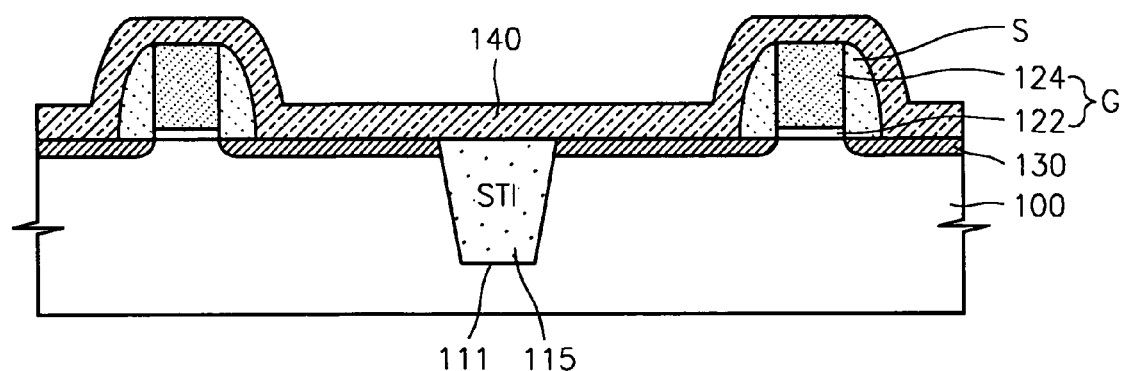
FIGS. 3 through 7 are cross-sectional views illustrating a method of fabricating a local interconnection for connecting a source/drain of a transistor to a source/drain of an adjacent transistor.

Referring to FIG. 3, a semiconductor substrate 100 is patterned using a mask for defining an active region pattern (110 of FIG. 2), thereby forming a shallow trench isolation (STI) structure. First, the semiconductor substrate 100 is etched to a depth of 300–10000 Å to form a trench 111. Subsequently, a thermal oxide layer (not shown) is formed by performing a heat treatment process, so as to recover damage to the semiconductor substrate 100 previously caused by the dry etch process of forming the trench 111. A nitride liner (not shown) is then formed as a stress-buffer layer to a thickness of 40–50 Å, and the trench 111 is buried with an insulating layer 115, and a heat treatment process is performed to densify the insulating layer 115. Subsequently, the insulating layer 115 is planarized by a chemical mechanical polishing (CMP) process or an etchback process, thereby completing the STI process, and defining an active region.

Subsequently, a gate oxide layer 122 and a polysilicon layer 124 are sequentially stacked on the active region defined by STI, and the polysilicon layer 124 and the gate oxide layer 122 are patterned using the mask for defining a gate pattern (120 of FIG. 2), to form a gate G. Ion implantation is then performed to form a lightly doped drain (LDD) region 130, and an insulating spacer S is formed on a sidewall of the gate G. Ion implantation is performed, for example, by implanting arsenic (As) ions at a concentration of $10^{14}$–$10^{15}$ with an energy of 20–40 KeV so as to form the LDD region 130. Subsequently, a selective epitaxial growth seed layer 140 is formed on the entire surface of the resultant structure. An $Si_xO_yN_z$ layer may be formed as the selective epitaxial growth seed layer 140. In the case of the $Si_xO_yN_z$ layer, preferably, x is 55, y is 15, and z is 30 so that $Si_xO_yN_z$ operates as an effective seed layer.

Figure 4:
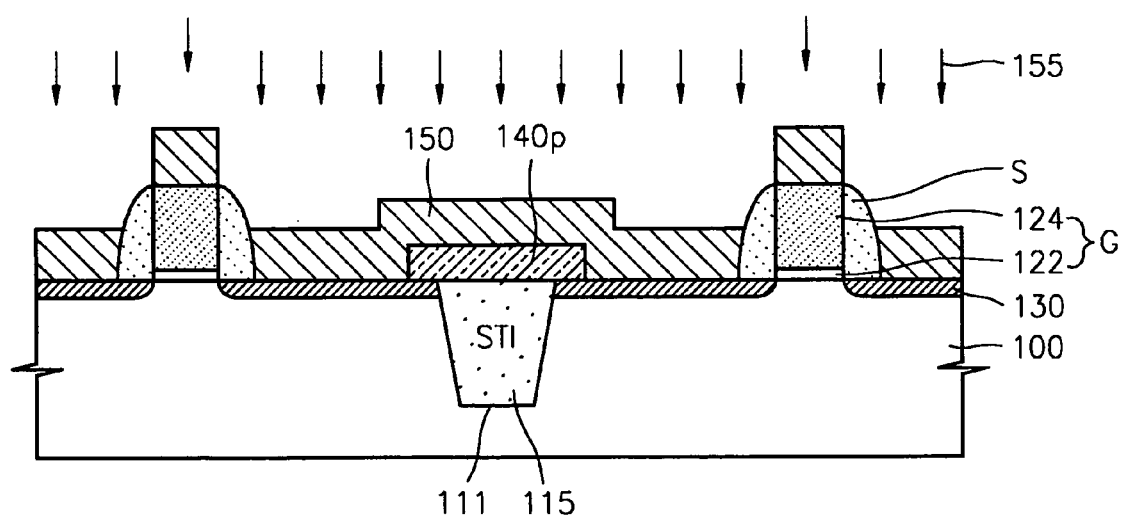

Referring to FIG. 4, a selective epitaxial growth seed layer pattern 140P is formed such that the pattern remains only in the region of the STI insulating structure, by patterning the selective epitaxial growth seed layer 140.

Subsequently, a selective epitaxial layer 150 is formed. A substrate 100 is loaded into a vacuum chamber the temperature of which is set to 850–950° C., and a Si-based source gas, e.g., $SiH_4$ or $Si_2H_6$ gas, is supplied to the chamber for 1–2 minutes. The selective epitaxial layer 150 is formed only on the active regions of the silicon substrate 100, on the selective epitaxial growth seed layer pattern 140P, and on the gate G. The selective epitaxial layer is not formed on the insulating spacer S. Subsequently, local interconnections LI1 and LI3 are formed by performing ion implantation 155. Ion implantation reduces the resistance of the selective epitaxial layer 150 so that the local interconnections LI1 and LI3 become conductive. Ion implantation 155 is performed by implanting phosphorous ions at a concentration of $10^{12}$–$10^{13}$ with an energy level of 20–50 KeV or by implanting arsenic (As) ions at a concentration of $10^{14}$–$10^{15}$ with an energy level of 20–40 KeV.

Figure 5:
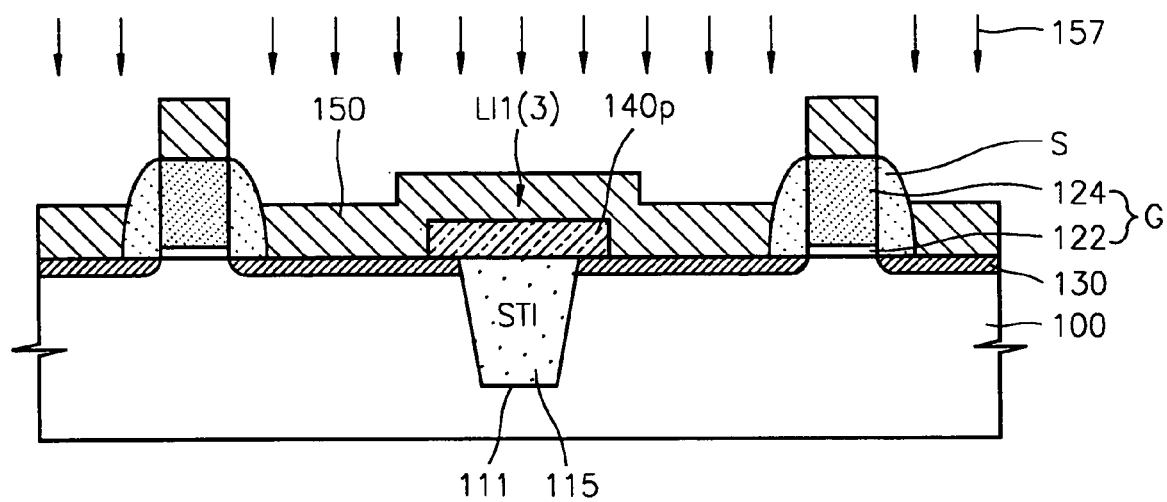

Subsequently, as shown in FIG. 5, ion implantation 157 is performed to form source/drain regions. Ion implantation 157 is performed, for example, by implanting arsenic (As) ions at a concentration of $10^{14}$–$10^{15}$ with an energy of 20–40 KeV.

Figure 6:
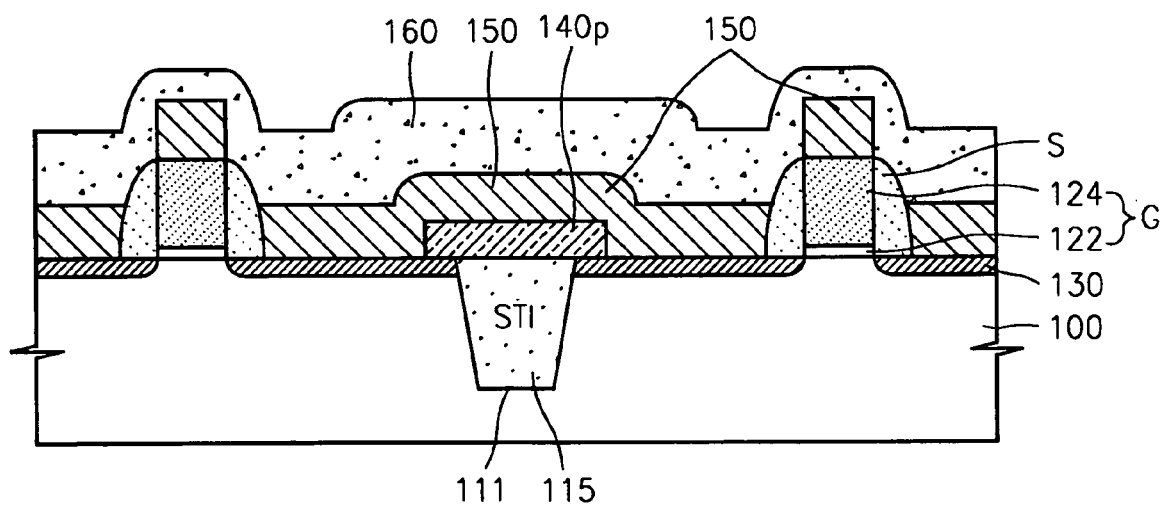

Referring to FIG. 6, a high-melting point metallic layer 160 is formed on the entire surface of the substrate 100. High-melting point metals include, for example, cobalt (Co), titanium (Ti), nickel (Ni), platinum (Pt), tungsten (W), and molybdenum (Mo).

Figure 7:
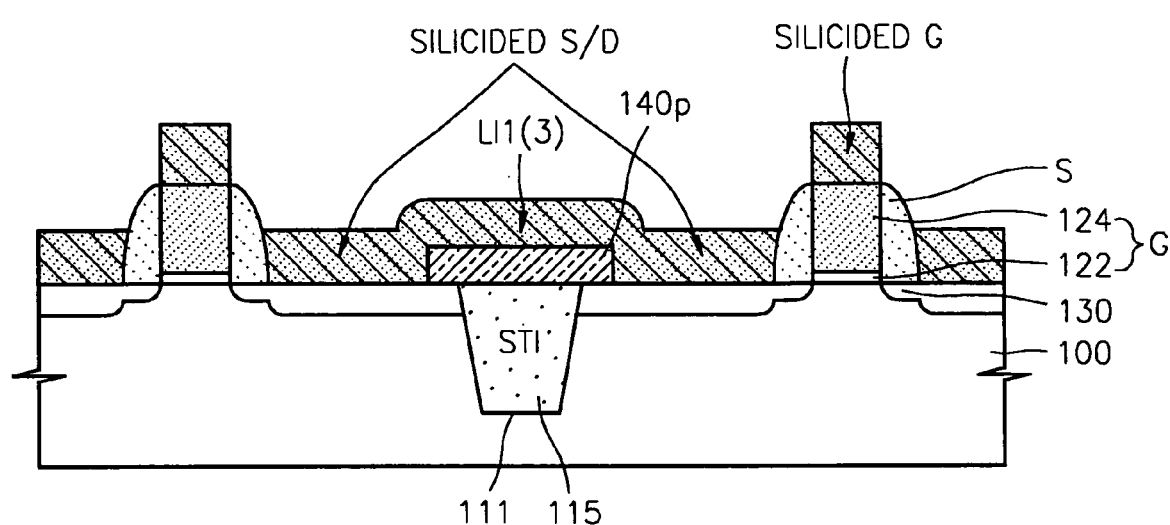

Subsequently, as shown in FIG. 7, silicidation is performed, for example by rapid thermal annealing, and any unreacted high-melting point metallic layer 160 is removed. As a result, the local interconnections LI1 and LI3 for connecting the silicided sources/drains of adjacent transistors are completed. The resistance of the local interconnections LI1 and LI3 can be more effectively reduced by silicidation.

In the embodiment described above, ion implantation 157 is performed to form the source/drain regions after the selective epitaxial layer 150 is formed. However, ion implantation 157 may be performed at any time, for example before and/or after the selective epitaxial layer 150 is formed. For example, ion implantation 157 may be performed to form the source/drain regions immediately after the insulating spacer S is formed on the sidewall of the gate G.

In addition, in the embodiment described above, the local interconnections LI1 and LI3 are completed by performing ion implantation on the selective epitaxial layer and by performing silicidation. However, the local interconnections may optionally be formed by implanting ions only on the selective epitaxial layer or by performing silicidation without performing ion implantation.

Figure 10:
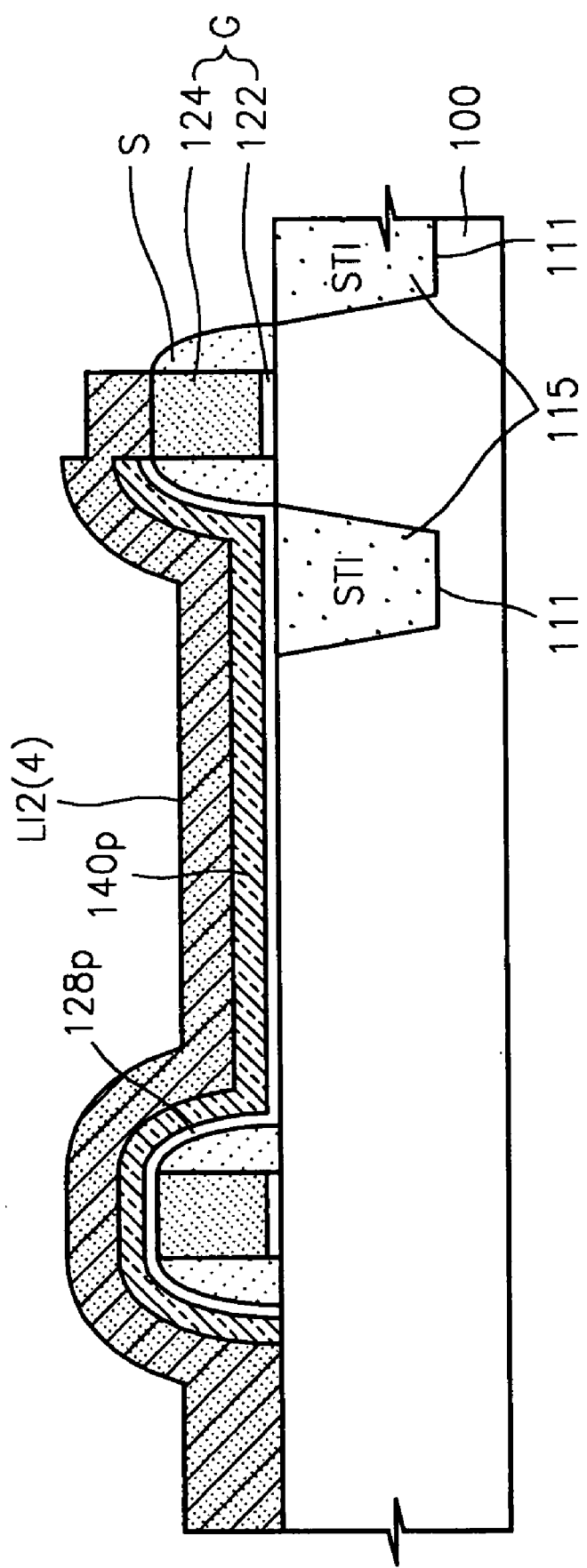

FIGS. 8 through 10 are cross-sectional views illustrating a method of fabricating local interconnections LI2 and LI4 for connecting the source/drain of a transistor to the gate of an adjacent transistor. For processes that are the same as those of the above method of fabricating local interconnection LI1 and LI3 for connecting the sources/drains of adjacent transistors to one another, descriptions thereof will be omitted below.

Referring to FIG. 8, an insulating layer is formed on the entire surface of a semiconductor substrate 100 on which STI, a gate G, and a sidewall spacer S are formed, and the insulating layer is patterned to form an insulating layer pattern 128P for exposing the source/drain of a transistor and the gate G of an adjacent transistor. Subsequently, a selective epitaxial growth seed layer 140 is formed on the entire surface of the substrate 100 on which the insulating layer pattern 128P is formed. An $Si_xO_yN_z$ layer may be formed as the selective epitaxial growth seed layer 140. In the case of the $Si_xO_yN_z$ layer, preferably, x is 55, y is 15, and z is 30 so that the $Si_xO_yN_z$ layer acts as an effective seed layer.

Referring to FIG. 9, the selective epitaxial growth seed layer 140 is patterned to form a selective epitaxial growth seed layer pattern 140P on the insulating layer pattern 128P.

Subsequently, as shown in FIG. 10, a selective epitaxial layer is formed on the silicon substrate 100 forming an active region, the selective epitaxial growth seed layer pattern 140P, and the exposed gate G. Then, the resistance of the selective epitaxial layer is reduced, thereby forming local interconnections LI2 and LI4 for connecting the gate of a transistor to the source/drain of an adjacent transistor. The resistance of the epitaxial layer may be reduced, for example, by proper ion implantation, silicidation, or a combination thereof.

As described above, an embodiment of forming local interconnections LI1 and LI3 for connecting sources/drains of adjacent transistors and an embodiment of forming local interconnections LI2 and LI4 for connecting a source/drain of a transistor to a gate of an adjacent transistor have been respectively explained. However, it would be apparent to those skilled in the art that the local interconnection LI1–LI4 of an SRAM device can be formed with most simplified processes by combining the above-described embodiments properly.

According to the present invention, local interconnections are fabricated through simple and easy processes. In addition, elevated source/drain regions are formed together with the formation of local interconnection at the same time such that punch-through and short channel effects of the transistor can be improved.

While this invention has been particularly shown and described with reference to preferred embodiments thereof, it will be understood by those skilled in the art that various changes in the thickness and size of each layer, materials, and formation methods thereof may be made therein without departing from the spirit and scope of the invention as defined by the appended claims.

What is claimed is:

1. A method of fabricating a local interconnection comprising:
    forming a selective epitaxial growth seed layer pattern on a region of a semiconductor substrate where a local interconnection is to be formed, the region including an active region on which a gate is formed;
    forming a selective epitaxial layer on the selective epitaxial growth seed layer pattern, on a top surface of the gate, and on an exposed surface of the semiconductor substrate by performing epitaxial growth on the resultant structure; and
    reducing a resistance of the selective epitaxial layer to complete the local interconnection.

2. The method of claim 1, further comprising, prior to forming the selective epitaxial growth seed layer pattern:
    forming a shallow trench isolation structure on the semiconductor substrate to define the active region;
    forming the gate on the active region; and
    forming a spacer on a sidewall of the gate, and
    wherein forming the selective epitaxial growth seed layer pattern comprises forming the selective epitaxial growth seed layer pattern on the shallow trench isolation structure, and forming the selective epitaxial layer comprises forming the selective epitaxial layer on the active region, the selective epitaxial growth seed layer pattern, and the gate, and
    wherein the local interconnection comprises a local interconnection for connecting a source/drain region of a transistor to a source/drain region of an adjacent transistor.

3. The method of claim 1, further comprising, prior to forming the selective epitaxial growth seed layer pattern:
    forming a shallow trench isolation structure on the semiconductor substrate to define the active region;
    forming the gate to comprise first and second adjacent gates on the active region;
    forming a spacer on sidewalls of the first and second gates; and
    forming an insulating layer pattern for exposing an active region adjacent the first gate and exposing the second gate, and
    wherein forming the selective epitaxial growth seed layer pattern comprises forming the selective epitaxial growth seed layer pattern on the insulating layer pattern, and forming the selective epitaxial layer comprises forming the selective epitaxial layer on the active region adjacent the first gate, the selective epitaxial growth seed layer pattern, and the second gate, and
    wherein the local interconnection comprises a local interconnection for connecting a source/drain region of a transistor to a gate of an adjacent transistor.

4. The method of claim 1, wherein reducing the resistance of the selective epitaxial layer to complete the local interconnection comprises reducing the resistance of the selective epitaxial layer by implanting ions into the selective epitaxial layer.

5. The method of claim 1, wherein reducing the resistance of the selective epitaxial layer to complete the local interconnection comprises reducing the resistance of the selective epitaxial layer by siliciding the selective epitaxial layer.

6. The method of claim 1, wherein reducing the resistance of the selective epitaxial layer to complete the local interconnection comprises:
    implanting ions into the selective epitaxial layer; and
    siliciding the selective epitaxial layer.

7. The method of claim 1, wherein the selective epitaxial growth seed layer pattern comprises an $Si_xO_yN_z$ layer pattern.

8. The method of claim 7, wherein the selective epitaxial growth seed layer pattern comprises an $Si_xO_yN_z$ layer pattern, and wherein x is 55, y is 15, and z is 30.

9. A method of fabricating a local interconnection comprising:
  forming a selective epitaxial growth seed layer pattern on a region of a semiconductor substrate where a local interconnection is to be formed;
  forming a selective epitaxial layer by performing epitaxial growth on the resultant structure; and
  reducing a resistance of the selective epitaxial layer to complete the local interconnection, and further comprising, prior to forming the selective epitaxial growth seed layer pattern:
    forming a shallow trench isolation structure on the semiconductor substrate to define an active region;
    forming first and second adjacent gates on the active region;
    forming a spacer on sidewalls of the first and second gates; and
    forming an insulating layer pattern for exposing an active region adjacent the first gate and exposing the second gate, and
  wherein forming the selective epitaxial growth seed layer pattern comprises forming the selective epitaxial growth seed layer pattern on the insulating layer pattern, and forming the selective epitaxial layer comprises forming the selective epitaxial layer on the active region adjacent the first gate, the selective epitaxial growth seed layer pattern, and the second gate, and
  wherein the local interconnection comprises a local interconnection for connecting a source/drain region of a transistor to a gate of an adjacent transistor.

10. The method of claim 9, wherein reducing the resistance of the selective epitaxial layer to complete the local interconnection comprises reducing the resistance of the selective epitaxial layer by implanting ions into the selective epitaxial layer.

11. The method of claim 9, wherein reducing the resistance of the selective epitaxial layer to complete the local interconnection comprises reducing the resistance of the selective epitaxial layer by siliciding the selective epitaxial layer.

12. The method of claim 9, wherein reducing the resistance of the selective epitaxial layer to complete the local interconnection comprises:
  implanting ions into the selective epitaxial layer; and
  siliciding the selective epitaxial layer.

13. The method of claim 9, wherein the selective epitaxial growth seed layer pattern comprises an $Si_xO_yN_z$ layer pattern.

14. The method of claim 13, wherein the selective epitaxial growth seed layer pattern comprises an $Si_xO_yN_z$ layer pattern, and wherein x is 55, y is 15, and z is 30.

15. A method of fabricating a local interconnection comprising:
  forming a selective epitaxial growth seed layer pattern on a region of a semiconductor substrate where a local interconnection is to be formed, wherein the selective epitaxial growth seed layer pattern comprises an $Si_xO_yN_z$ layer pattern;
  forming a selective epitaxial layer by performing epitaxial growth on the resultant structure; and
  reducing a resistance of the selective epitaxial layer to complete the local interconnection.

16. The method of claim 15, wherein the selective epitaxial growth seed layer pattern comprises an $Si_xO_yN_z$ layer pattern, and wherein x is 55, y is 15, and z is 30.

17. The method of claim 15, further comprising, prior to forming the selective epitaxial growth seed layer pattern:
  forming a shallow trench isolation structure on the semiconductor substrate to define an active region;
  forming a gate on the active region; and
  forming a spacer on a sidewall of the gate, and
  wherein forming the selective epitaxial growth seed layer pattern comprises forming the selective epitaxial growth seed layer pattern on the shallow trench isolation structure, and forming the selective epitaxial layer comprises forming the selective epitaxial layer on the active region, the selective epitaxial growth seed layer pattern, and the gate, and
  wherein the local interconnection comprises a local interconnection for connecting a source/drain region of a transistor to a source/drain region of an adjacent transistor.

18. The method of claim 15, further comprising, prior to forming the selective epitaxial growth seed layer pattern:
  forming a shallow trench isolation structure on the semiconductor substrate to define an active region;
  forming first and second adjacent gates on the active region;
  forming a spacer on sidewalls of the first and second gates; and
  forming an insulating layer pattern for exposing an active region adjacent the first gate and exposing the second gate, and
  wherein forming the selective epitaxial growth seed layer pattern comprises forming the selective epitaxial growth seed layer pattern on the insulating layer pattern, and forming the selective epitaxial layer comprises forming the selective epitaxial layer on the active region adjacent the first gate, the selective epitaxial growth seed layer pattern, and the second gate, and
  wherein the local interconnection comprises a local interconnection for connecting a source/drain region of a transistor to a gate of an adjacent transistor.

19. The method of claim 15, wherein reducing the resistance of the selective epitaxial layer to complete the local interconnection comprises reducing the resistance of the selective epitaxial layer by implanting ions into the selective epitaxial layer.

20. The method of claim 15, wherein reducing the resistance of the selective epitaxial layer to complete the local interconnection comprises reducing the resistance of the selective epitaxial layer by siliciding the selective epitaxial layer.

21. The method of claim 15, wherein reducing the resistance of the selective epitaxial layer to complete the local interconnection comprises:
  implanting ions into the selective epitaxial layer; and
  siliciding the selective epitaxial layer.

* * * * *